US012777731B2

(12) United States Patent
Huang et al.

(10) Patent No.: US 12,777,731 B2
(45) Date of Patent: Oct. 27, 2026

(54) OPTICAL FILTER ARRAY, MOBILE TERMINAL, AND DEVICE

(71) Applicant: HUAWEI TECHNOLOGIES CO., LTD., Shenzhen (CN)

(72) Inventors: Tao Huang, Beijing (CN); Hui Yang, Beijing (CN); Zhaohui Wu, Shenzhen (CN); Youming Zhang, Shenzhen (CN)

(73) Assignee: Huawei Technologies Co., LTD., Shenzhen (CN)

( * ) Notice: Subject to any disclaimer, the term of this patent is extended or adjusted under 35 U.S.C. 154(b) by 506 days.

(21) Appl. No.: 18/159,724

(22) Filed: Jan. 26, 2023

(65) Prior Publication Data

US 2023/0170363 A1 Jun. 1, 2023

Related U.S. Application Data

(63) Continuation of application No. PCT/CN2020/104797, filed on Jul. 27, 2020.

(51) Int. Cl.
*H10F 39/00* (2025.01)
*G02B 5/20* (2006.01)
*H04N 23/11* (2023.01)

(52) U.S. Cl.
CPC ......... *H10F 39/8053* (2025.01); *G02B 5/201* (2013.01); *H04N 23/11* (2023.01); *H10F 39/8063* (2025.01)

(58) Field of Classification Search
CPC . H10F 39/8053; H10F 39/8063; H04N 23/11; H04N 25/131; H04N 25/135; G06T 3/4015; G02B 5/201
See application file for complete search history.

(56) References Cited

U.S. PATENT DOCUMENTS

2014/0320611 A1* 10/2014 Choi .................... H04N 25/134 348/47
2015/0029366 A1* 1/2015 Numata ................. G02B 5/201 348/273

(Continued)

FOREIGN PATENT DOCUMENTS

CN 109856058 A 6/2019
CN 109883959 A 6/2019

(Continued)

OTHER PUBLICATIONS

CN111386549 English translation (Year: 2020).*

(Continued)

*Primary Examiner* — Shaun M Campbell
(74) *Attorney, Agent, or Firm* — Fish & Richardson P.C.

(57) ABSTRACT

This application discloses example optical filter arrays, including a first-type optical filter array and a second-type optical filter array, where the first-type optical filter array comprises spectral information of a first band range, the second-type optical filter array comprises spectral information of a second band range, and the spectral information of the second band range is different from the spectral information of the first band range. Alternatively, the spectral information of the second band range and the spectral information of the first band range overlap within a preset band range. Embodiments of this application further provide example mobile terminals, example intelligent vehicles, example monitoring devices, and example electronic devices.

20 Claims, 11 Drawing Sheets

(56) References Cited

U.S. PATENT DOCUMENTS

| | | | | |
|---|---|---|---|---|
| 2015/0268392 | A1* | 9/2015 | Kobayashi | H04N 25/134 348/336 |
| 2015/0281666 | A1* | 10/2015 | Chen | H04N 25/61 348/302 |
| 2017/0150071 | A1 | 5/2017 | Otsubo et al. | |
| 2019/0297278 | A1 | 9/2019 | Sumi et al. | |

FOREIGN PATENT DOCUMENTS

| | | | |
|---|---|---|---|
| CN | 110620861 | A | 12/2019 |
| CN | 111386549 | A | 7/2020 |

OTHER PUBLICATIONS

Extended European Search Report in European Appln No. 20946880.0, dated Jul. 7, 2023, 8 pages.

Office Action in European Appln. No. 20946880.0, mailed on Mar. 6, 2026, 16 pages.

* cited by examiner

OPTICAL FILTER ARRAY, MOBILE TERMINAL, AND DEVICE

CROSS-REFERENCE TO RELATED APPLICATIONS

This application is a continuation of International Application No. PCT/CN2020/104797, filed on Jul. 27, 2020, the disclosure of which is hereby incorporated by reference in its entirety.

TECHNICAL FIELD

This application relates to the field of image processing technologies, and in particular, to an optical filter array, a mobile terminal, and a device.

BACKGROUND

A hyperspectral imaging technology or a multispectral imaging technology is an image data technology based on a very large quantity of bands. In the hyperspectral imaging technology or the multispectral imaging technology, advanced technologies in fields such as optics, optoelectronics, electronics, information processing, and computer science are integrated, and the hyperspectral imaging technology or the multispectral imaging technology is a new technology in which a conventional two-dimensional imaging technology and a spectral technology are organically combined. In the hyperspectral imaging technology or the multispectral imaging technology, spectral information of a measured object is obtained when spatial feature imaging of the object is obtained.

The hyperspectral imaging technology or the multispectral imaging technology has characteristics such as a super multi-band, a hyperspectral resolution, a narrow band, a wide spectral range, and synchronous obtaining of an image and a spectrum, and an amount of collected image information is rich. Because the hyperspectral imaging technology or the multispectral imaging technology may be used to more accurately describe spectral information of a physical world, to implement more accurate spectral detection, the hyperspectral imaging technology or the multispectral imaging technology is widely applied to fields such as an accurate color and material detection. However, a current solution for improving a resolution of a hyperspectral image or a multispectral image has high costs. Therefore, how to improve the resolution of the hyperspectral image or the multispectral image without increasing costs needs to be resolved as soon as possible.

SUMMARY

Embodiments of this application provide an optical filter array, to obtain a high-resolution hyperspectral image at low costs.

To achieve the foregoing objective, embodiments of this application provide the following technical solutions.

According to a first aspect of this application, an optical filter array is provided. The optical filter array may include a first-type optical filter array and a second-type optical filter array. The first-type optical filter array covers spectral information of a first band range, the second-type optical filter array covers spectral information of a second band range, and the spectral information of the second band range is different from the spectral information of the first band range. For example, a first-type color filter array covers spectral information of a visible light band, a second-type color filter array may cover spectral information of a near-infrared band. For another example, a first-type color filter array covers spectral information of a first part of a visible light band, a second-type color filter array may cover spectral information of a second part of the visible light band, and the first part of the visible light band is different from the second part of the visible light band. Alternatively, the spectral information of the second band range and the spectral information of the first band range overlap within a preset band range. For example, the first-type color filter array covers the spectral information of the first part of the visible light band, the second-type color filter array may cover the spectral information of the second part of the visible light band, and the first part of the visible light band and the second part of the visible light band partially overlap. For example, it is assumed that the first-type color filter array covers red spectral information, green spectral information, and blue spectral information, and the second-type color filter array may cover the red spectral information and the spectral information of the near-infrared band. In other words, the spectral information covered by the second-type color filter array and the spectral information covered by the first-type color filter array may overlap within a preset range. The following provides an explanation from a perspective of a channel. One channel represents one spectral response function. In this application, sometimes, one channel alternatively represents one type of spectral information. Therefore, channels included in the second-type color filter array are completely different from channels included in the first-type color filter array, or channels included in the second-type color filter array are partially the same as channels included in the first-type color filter array. In a design in which the channels included in the second-type color filter array are partially the same as the channels included in the first-type color filter array, in a implementation, the second-type color filter array and the first-type color filter array have one same channel, or two same channels. It can be learned from the first aspect that the optical filter array provided in this application includes two types of optical filter arrays. The spectral information covered by the second-type color filter array is different from the spectral information covered by the first-type color filter array, or the spectral information covered by the second-type color filter array and the spectral information covered by the first-type color filter array overlap within the preset range. Therefore, the spectral information covered by the second-type color filter array may supplement the spectral information covered by the first-type color filter array. To obtain a hyperspectral high-resolution image, in the solution provided in this application, not all color filter arrays need to be hyperspectral optical filter arrays. A larger quantity of hyperspectral filter arrays leads to higher costs of improving a resolution. A reason is that pupil brightness needs to have a specific value if a sensor needs to perform imaging, and the value of the pupil brightness is in a positive correlation relationship with an image resolution and a spectral resolution. If the spectral resolution is very high (hyperspectral or multispectral), the image resolution needs to be reduced to ensure sufficient energy for imaging. However, currently, on a mobile phone or a camera, it is desirable to reduce an area of the sensor or an optical filter array as much as possible. Therefore, a larger quantity of hyperspectral filter arrays leads to greater difficulty in improving the resolution and higher costs. Alternatively, it can be understood that difficulty in processing a narrowband filter for hyperspectral imaging is great, and difficulty in manufacturing a small-size narrowband filter is greater. Consequently, a high-resolution hyperspectral camera brings about a great challenge and has high costs. In this application, a quantity of hyperspectral filter arrays included in the color filter array may be reduced, and the image resolution may be improved by using a low-spectral color filter array and a corresponding algorithm. For example, in a design, a quantity of channels included in the second-type color filter array is greater than a quantity of channels included in the first-type color filter array, a low-resolution hyperspectral image may be obtained by using the second-type color filter array, a high-resolution low-spectral image is obtained by using the first-type color filter array, and data obtained by using the first-type color filter array and data obtained by using the second-type color filter array are fused, to obtain a high-resolution hyperspectral image. For another example, in another design, although the quantity of channels included in the second-type color filter array is the same as the quantity of channels included in the first-type color filter array, or the quantity of channels included in the second-type color filter array is less than the quantity of channels included in the first-type color filter array, and the spectral information covered by the second-type color filter array may supplement the spectral information covered by the first-type color filter array, the data obtained by using the first-type color filter array and the data obtained by using the second-type color filter array may be fused by using a related algorithm, to obtain a low-resolution hyperspectral image, and then the image resolution is improved based on a related algorithm, to obtain a high-resolution hyperspectral image.

Optionally, with reference to the first aspect, in a first possible implementation, the first-type optical filter array may include an optical filter array including three channels, and each of the three channels that may be included in the first-type optical filter array is used to represent one type of spectral information within the first band range. It can be learned from the first possible implementation of the first aspect that a specific first-type optical filter array is provided, to increase diversity in solutions.

Optionally, with reference to the first possible implementation of the first aspect, in a second possible implementation, the three channels are any three channels in a red channel R, a green channel G, a blue channel B, a yellow channel Y, and a near-infrared channel IR.

Optionally, with reference to the first or the second possible implementation of the first aspect, in a third possible implementation, a quantity of channels that may be included in the second-type optical filter array is a positive integer greater than 3, and one channel that may be included in the second-type optical filter array is used to represent one type of spectral information within the second band range.

Optionally, with reference to the second possible implementation of the first aspect, in a fourth possible implementation, the three channels are any one channel in an RGB channel, an RYB channel, or an RBGIR channel.

Optionally, with reference to the first aspect, in a fifth possible implementation, the first-type optical filter array may include an optical filter array including four channels, or the first-type optical filter array may include an optical filter array including three channels and an optical filter array including four channels, and a quantity of channels of the second-type optical filter array is a positive integer greater than 4.

Optionally, with reference to the fifth possible implementation of the first aspect, in a sixth possible implementation, the four channels are any four channels in a red channel R, a green channel G, a blue channel B, a yellow channel Y, and a near-infrared channel IR.

Optionally, with reference to the fifth or the sixth possible implementation of the first aspect, in a seventh possible implementation, a quantity of channels of the second-type optical filter array is a positive integer not less than 4 and not greater than 25, and one channel that may be included in the second-type optical filter array is used to represent one type of spectral information within the second band range.

Optionally, with reference to the first aspect or the first to the seventh possible implementations of the first aspect, in an eighth possible implementation, the first-type optical filter array and the second-type optical filter array each are a matrix structure.

Optionally, with reference to the first aspect or the first to the eighth possible implementations of the first aspect, in a ninth possible implementation, the optical filter array may include a plurality of groups of first-type optical filter arrays and a plurality of groups of second-type optical filter arrays, and the plurality of groups of first-type optical filter arrays surround the plurality of groups of second-type optical filter arrays.

Optionally, with reference to the ninth possible implementation of the first aspect, in a tenth possible implementation, a shorter distance to a center of the optical filter array leads to higher distribution density of the second-type optical filter array and lower distribution density of the first-type optical filter array.

Optionally, with reference to the first aspect or the first to the eighth possible implementations of the first aspect, in an eleventh possible implementation, the optical filter array may include a plurality of groups of first-type optical filter arrays and a plurality of groups of second-type optical filter arrays, and the plurality of groups of second-type optical filter arrays surround the plurality of groups of first-type optical filter arrays.

Optionally, with reference to the first aspect or the first to the eighth possible implementations of the first aspect, in a twelfth possible implementation, the optical filter array may include a plurality of groups of first-type optical filter arrays and a plurality of groups of second-type optical filter arrays, and the plurality of groups of first-type optical filter arrays and the plurality of groups of second-type optical filter arrays are disposed in parallel.

Optionally, with reference to the ninth to the twelfth possible implementations of the first aspect, in a thirteenth possible implementation, in the optical filter array, the second-type optical filter array is periodically distributed or aperiodically distributed.

Optionally, with reference to the ninth to the thirteenth possible implementations of the first aspect, in a fourteenth possible implementation, a total area of the plurality of groups of first-type optical filter arrays is greater than a total area of the plurality of groups of second-type optical filter arrays.

Optionally, with reference to the first to the fourteenth possible implementations of the first aspect, in a fifteenth possible implementation, the first-type optical filter array may include a color filter, a microlens, and a photoelectric conversion unit, the photoelectric conversion unit is configured to convert an optical signal into an electrical signal, the color filter is located between the microlens and the photoelectric conversion unit, and for one first-type optical filter array, one microlens corresponds to one color filter and corresponds to one photoelectric conversion unit, or one microlens corresponds to one color filter and corresponds to a plurality of photoelectric conversion units, or one color filter corresponds to a plurality of microlenses and corresponds to a plurality of photoelectric conversion units.

Optionally, with reference to the first to the fourteenth possible implementations of the first aspect, in a sixteenth possible implementation, the second-type optical filter array may include a color filter, a microlens, and a photoelectric conversion unit, the photoelectric conversion unit is configured to convert an optical signal into an electrical signal, the color filter is located between the microlens and the photoelectric conversion unit, and for one second-type optical filter array, one microlens corresponds to one color filter and corresponds to one photoelectric conversion unit, or one microlens corresponds to one color filter and corresponds to a plurality of photoelectric conversion units, or one color filter corresponds to a plurality of microlenses and corresponds to a plurality of photoelectric conversion units.

According to a second aspect of this application, a camera module is provided. The camera module may include a base and an optical filter array, the optical filter array is mounted on the base, and the optical filter array is the optical filter array described in any one of the first aspect or the possible implementations of the first aspect.

Optionally, with reference to the second aspect, in a first possible implementation, the camera module may further include a processor and a memory, the processor and the memory are coupled, the memory stores program instructions related to image processing, and when the program instructions stored in the memory are executed by the processor, illumination intensity estimation, white balance processing, and demosaicing processing are performed on an image obtained by a first-type optical filter array, to obtain a first image; illumination intensity estimation, white balance processing, and demosaicing processing are performed on an image obtained by a second-type optical filter array, to obtain a second image; and fusion processing is performed on the first image and the second image, to obtain a high-resolution hyperspectral image.

According to a third aspect of this application, a camera is provided. The camera may include a housing and a camera module, the camera module is accommodated in the housing, and the camera module is the camera module described in the second aspect.

Optionally, with reference to the third aspect, in a first possible implementation, the camera may further include a processor and a memory, the processor and the memory are coupled, the memory stores program instructions related to image processing, and when the program instructions stored in the memory are executed by the processor, illumination intensity estimation, white balance processing, and demosaicing processing are performed on an image obtained by a first-type optical filter array, to obtain a first image; illumination intensity estimation, white balance processing, and demosaicing processing are performed on an image obtained by a second-type optical filter array, to obtain a second image; and fusion processing is performed on the first image and the second image, to obtain a high-resolution hyperspectral image.

According to a fourth aspect of this application, a mobile terminal is provided. The mobile terminal may include a lens, a lens mount, and an optical filter array, the lens is mounted on the lens mount, and the lens mount is disposed between the optical filter array and the lens. The optical filter array is the optical filter array described in any one of the first aspect or the possible implementations of the first aspect.

Optionally, with reference to the fourth aspect, in a first possible implementation, the mobile terminal may further include a processor and a memory, the processor and the memory are coupled, the memory stores program instructions related to image processing, and when the program instructions stored in the memory are executed by the processor, illumination intensity estimation, white balance processing, and demosaicing processing are performed on an image obtained by a first-type optical filter array, to obtain a first image; illumination intensity estimation, white balance processing, and demosaicing processing are performed on an image obtained by a second-type optical filter array, to obtain a second image; and fusion processing is performed on the first image and the second image, to obtain a high-resolution hyperspectral image.

According to a fifth aspect of this application, an intelligent vehicle is provided. The intelligent vehicle may include a lens, a lens mount, and an optical filter array, the lens is mounted on the lens mount, and the lens mount is disposed between the optical filter array and the lens. The optical filter array is the optical filter array described in any one of the first aspect or the possible implementations of the first aspect.

Optionally, with reference to the fifth aspect, in a first possible implementation, the intelligent vehicle may further include a processor and a memory, the processor and the memory are coupled, the memory stores program instructions related to image processing, and when the program instructions stored in the memory are executed by the processor, illumination intensity estimation, white balance processing, and demosaicing processing are performed on an image obtained by a first-type optical filter array, to obtain a first image; illumination intensity estimation, white balance processing, and demosaicing processing are performed on an image obtained by a second-type optical filter array, to obtain a second image; and fusion processing is performed on the first image and the second image, to obtain a high-resolution hyperspectral image.

According to a sixth aspect of this application, a monitoring device is provided. The monitoring device may include a lens, a lens mount, and an optical filter array, the lens is mounted on the lens mount, and the lens mount is disposed between the optical filter array and the lens. The optical filter array is the optical filter array described in any one of the first aspect or the possible implementations of the first aspect.

Optionally, with reference to the sixth aspect, in a first possible implementation, the monitoring device may further include a processor and a memory, the processor and the memory are coupled, the memory stores program instructions related to image processing, and when the program instructions stored in the memory are executed by the processor, illumination intensity estimation, white balance processing, and demosaicing processing are performed on an image obtained by a first-type optical filter array, to obtain a first image; illumination intensity estimation, white balance processing, and demosaicing processing are performed on an image obtained by a second-type optical filter array, to obtain a second image; and fusion processing is performed on the first image and the second image, to obtain a high-resolution hyperspectral image.

According to a seventh aspect of this application, an electronic device is provided. The electronic device may include a lens, a lens mount, and an optical filter array, the lens is mounted on the lens mount, and the lens mount is disposed between the optical filter array and the lens. The optical filter array is the optical filter array described in any one of the first aspect or the possible implementations of the first aspect.

Optionally, with reference to the seventh aspect, in a first possible implementation, the electronic device may further include a processor and a memory, the processor and the memory are coupled, the memory stores program instructions related to image processing, and when the program instructions stored in the memory are executed by the processor, illumination intensity estimation, white balance processing, and demosaicing processing are performed on an image obtained by a first-type optical filter array, to obtain a first image; illumination intensity estimation, white balance processing, and demosaicing processing are performed on an image obtained by a second-type optical filter array, to obtain a second image; and fusion processing is performed on the first image and the second image, to obtain a high-resolution hyperspectral image.

DESCRIPTION OF EMBODIMENTS

Figure 1:
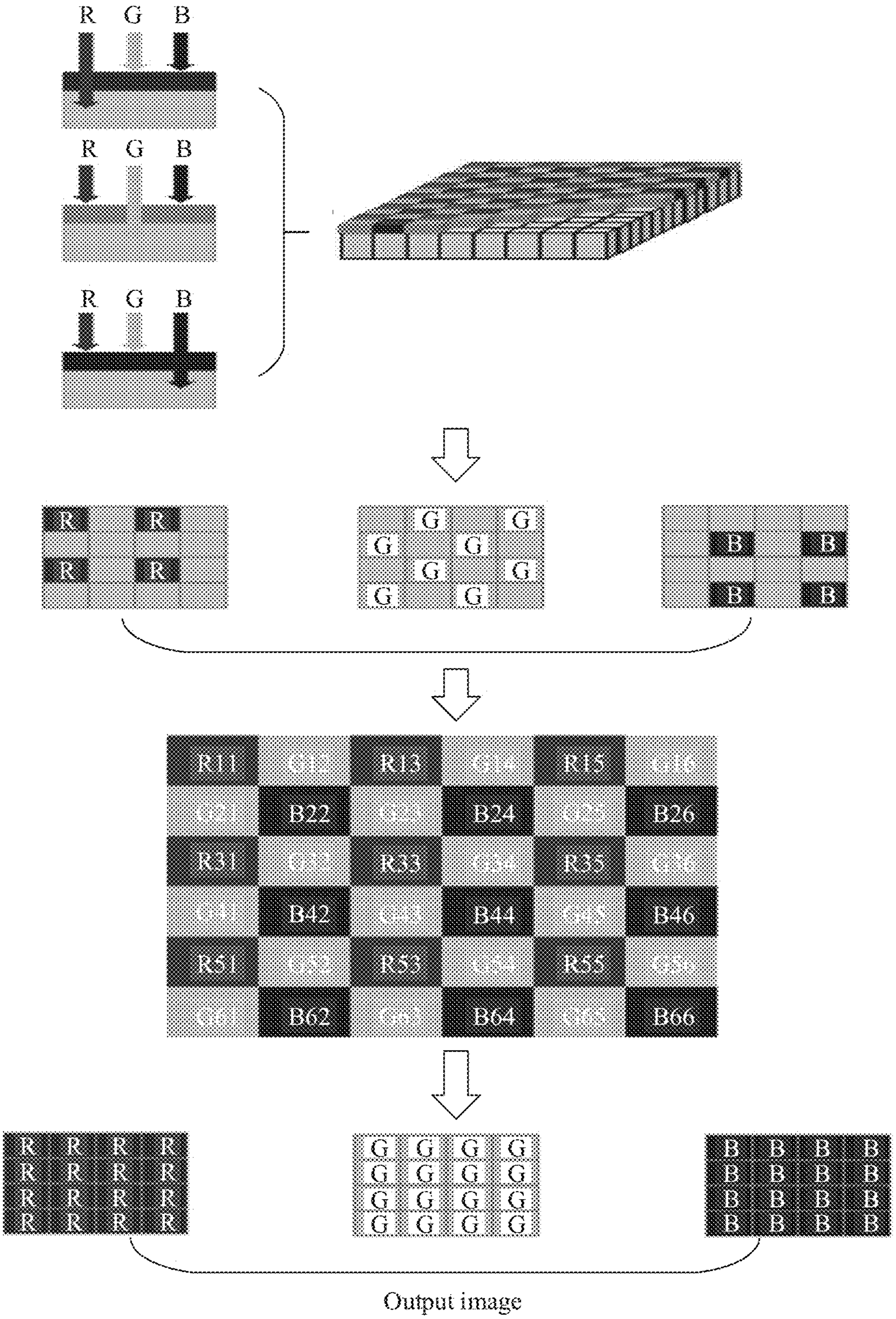
FIG. 1 is a schematic diagram of a principle of a Bayer array.

The following clearly and describes the technical solutions in embodiments of this application with reference to the accompanying drawings in embodiments of this application. It is clear that the described embodiments are merely some but not all of embodiments of this application.

In the specification, claims, and accompanying drawings of this application, the terms "first", "second", "third", "fourth", and so on (if existent) are intended to distinguish between similar objects but do not necessarily indicate a specific order or sequence. It should be understood that the data termed in such a way are interchangeable in proper circumstances so that embodiments of the present invention described herein can be implemented in other orders than the order illustrated or described herein. In addition, the terms "include" and "have" and any other variants are intended to cover the non-exclusive inclusion. For example, a process, method, system, product, or device that includes a list of steps or units is not necessarily limited to those expressly listed steps or units, but may include other steps or units not expressly listed or inherent to such a process, method, product, or device.

In descriptions of this application, "a plurality of" means two or more, unless specifically specified otherwise.

In this application, terms "installation" "joint", "connection", "fastening", and "disposing" should be understood in a broad sense unless otherwise expressly stipulated or limited. For example, "connection" may be a fixed connection, a detachable connection, or an integrated connection; may be a mechanical connection; may be an electrical connection; may be a direct connection; may be an indirect connection based on an intermediate medium; or may be communication inside two elements or an interaction relationship between two elements. For a person of ordinary skill in the art, a specific meaning of the terms in this application may be understood based on a specific situation.

In the descriptions of this application, it should be understood that directions or location relationships indicated by terms such as "length", "width", "up", "down", "front", "back", "left", "right", "vertical", "horizontal", "top", "bottom", "inside", and "outside" are based on directions or location relationships shown by the accompanying drawings, and are used only for describing this application and for description simplicity, but do not indicate or imply that an indicated apparatus or element needs to have a specific direction or needs to be constructed and operated in a specific direction. Therefore, this cannot be understood as a limitation on this application.

Some terms are used in the specification and claims to indicate particular components. It can be understood by a person skilled in the art that a hardware manufacturer may name a same component by using different terms. In the specification and the following claims, components are not distinguished by using a difference between names, but are distinguished by using a difference between functions of the components as a reference. A term "including" or "comprising" in the specification and claims is an open term, and therefore shall be construed as "including but not limited to" or "comprising but not limited to".

To better understand this application, the following specifically describes a research idea of the technical solution described in this application.

First, a Bayer array in the conventional technology is described. The Bayer array is a common method used to collect a digital image when a charge coupled device (charge coupled device, CCD) or a complementary metal-oxide-semiconductor (complementary metal-oxide semiconductor, CMOS) is used as an optical sensor.

An image sensor converts a ray of light into a current. A brighter ray of light leads to a larger current value, and a darker ray of light leads to a smaller current value. However, the image sensor has a serious disadvantage: The image sensor can only sense intensity of light, but cannot sense a wavelength of light. Because a color of light is determined based on the wavelength, the image sensor cannot record the color. To obtain a color image, a solution is to use only one image sensor and dispose a color filter array (color filter array, CFA) before the image sensor. In the Bayer array, instead of a case of disposing filters in different colors on each pixel (pixel), one filter in a single color is disposed on each pixel at intervals. In other words, each pixel of the image sensor is an independent photoelectric conversion unit, and can only convert a collected ray of light from intensity into a voltage signal and output the voltage signal. In other words, the pixel is a monochromatic image sensor. The pixel can record the color because before photoelectric conversion is performed, a ray of light with a specific color is projected onto the pixel to complete collection of intensity of light, and therefore, a corresponding relationship between a specific "monochromatic light" and intensity of light obtained by the photoelectric conversion unit is established. In this case, a picture with some vacant values can be obtained on each channel, and the vacant values may be filled by using various interpolation means. The following specifically describes the Bayer array with reference to FIG. 1. In an implementation solution, the Bayer array is a color filter Bayer array including optical filters in different colors. After "monochromatic light" is separately obtained by filtering light, the monochromatic light is transmitted to the pixel to record intensity separately, and a corresponding relationship between "monochromatic light" including a Bayer array and a voltage obtained by the photoelectric conversion unit is established. It should be noted that, in this application, the optical filter is sometimes also referred to as a color filter, and optical filtering is referred to as color filtering. When a difference between optical filtering and color filtering is not emphasized, optical filtering and color filtering have a same meaning. As shown in FIG. 1, the Bayer array usually includes optical filters in only three colors: red, green, and blue. The color filter is in a one-to-one correspondence with the pixel of the image sensor, and only one of three light types of red (R), green (G), and blue (B) can pass through each color filter. Optical filter points that different colors may pass through are regularly arranged. Green points are distributed at an upper right location and a lower left location of each green point, blue points are distributed at an upper location and a lower location, and red points are distributed at a left location and a right location. A quantity of green points is two times of a quantity of red points or a quantity of blue points, because it is found through research that a human eye is most sensitive to green. Currently, an obtained image includes only three colors, and it is clear that a color of a real world cannot be expressed. Therefore, an original value of each pixel further needs to be approximately restored based on a color around the pixel, and finally, a color image is obtained. This process is referred to as "demosaicing (demosaicing)". There are different methods for implementing demosaicing. For example, a simple interpolation method. For example, a pixel of a green filter accurately measures a green component, and a red component and a blue component of the pixel are obtained from a neighbor. A red value of a green pixel may be calculated by performing interpolation on two adjacent red pixels, and a blue value can also be calculated by performing interpolation on two adjacent blue pixels. For example, R33 shown in FIG. 1 is used as an example. A red component R33, a green component G33, and a blue component B33 in R33 may be represented based on the following formula:

$$R33 = R33$$

$$G33 = \frac{(G23 + G32 + G34 + G43)}{4}$$

$$B33 = \frac{(B22 + B24 + B42 + B44)}{4}$$

A red component, a green component, and a blue component included in each pixel may be obtained through demosaicing, and a final output color image is obtained.

However, an amount of image information collected through three channels, namely, RGB channels is not rich enough, and spectral information of a physical world cannot be accurately depicted. A hyperspectral imaging technology has characteristics such as a super multi-band, a hyperspectral resolution, a narrow band, a wide spectral range, and synchronous obtaining of an image and a spectrum, and an amount of collected image information is rich. Therefore, the hyperspectral imaging technology is widely applied to fields such as an accurate color and material detection. However, a resolution of an image obtained by using the hyperspectral imaging technology is low, and costs of improving the resolution are high. For example, a color image is obtained through demosaicing. If there are only three channels, namely, RGB channels, for one pixel, other two color components need to be calculated. During hyperspectral imaging, for one pixel, a large quantity of other color components may need to be guessed, to greatly increase a calculation amount and increase costs. Therefore, how to improve a resolution of a hyperspectral image without increasing costs needs to be resolved as soon as possible.

To address the problem, this application provides an optical filter array. The optical filter array includes two types of type arrays. A first-type optical filter array is configured to obtain a high-resolution low-spectral image. For example, the first-type optical filter array may be the Bayer array. A second-type optical filter array is configured to obtain a low-resolution hyperspectral image. For example, the second-type optical filter array is a multispectral optical filter array. An optical filter array of such a structure may obtain a high-resolution hyperspectral image in one imaging process. The optical filter array not only has a simple structure, but also may be used to reduce costs of improving the resolution of the hyperspectral image.

Based on the research idea, the following specifically describes the technical solutions provided in this application.

An optical filter array provided in an embodiment of this application includes a first-type optical filter array and a second-type optical filter array. The first-type optical filter array covers spectral information of a first band range, the second-type optical filter array covers spectral information of a second band range, and the spectral information of the second band range is different from the spectral information of the first band range. For example, a first-type color filter array covers spectral information of a visible light band, a second-type color filter array may cover spectral information of a near-infrared band. For another example, a first-type color filter array covers spectral information of a first part of a visible light band, a second-type color filter array may cover spectral information of a second part of the visible light band, and the first part of the visible light band is different from the second part of the visible light band. Alternatively, the spectral information of the second band range and the spectral information of the first band range overlap within a preset band range.

An explanation is provided from a perspective of a channel. One channel represents one spectral response function. In this application, in other words, one channel represents one type of spectral information. Therefore, channels included in the second-type color filter array are completely different from channels included in the first-type color filter array, or channels included in the second-type color filter array are partially the same as channels included in the first-type color filter array.

In a design, a quantity of channels included in the second-type color filter array is greater than a quantity of channels included in the first-type color filter array, a low-resolution hyperspectral image may be obtained by using the second-type color filter array, a high-resolution low-spectral image is obtained by using the first-type color filter array, and data obtained by using the first-type color filter array and data obtained by using the second-type color filter array are fused, to obtain a high-resolution hyperspectral image. For another example, in another design, although the quantity of channels included in the second-type color filter array is the same as the quantity of channels included in the first-type color filter array, or the quantity of channels included in the second-type color filter array is less than the quantity of channels included in the first-type color filter array, and the spectral information covered by the second-type color filter array may supplement the spectral information covered by the first-type color filter array, the data obtained by using the first-type color filter array and the data obtained by using the second-type color filter array may be fused by using a related algorithm, to obtain a low-resolution hyperspectral image, and then the image resolution is improved based on a related algorithm, to obtain a high-resolution hyperspectral image. The following separately describes the two designs.

In a possible implementation, it may be considered that the first-type optical filter array includes a small amount of spectral information, and the second-type optical filter array includes a large amount of spectral information. It may be considered that the first-type optical filter array is configured to obtain a low-spectral image, and the second-type optical filter array is configured to obtain a hyperspectral image. In a implementation, the first-type optical filter array includes three channels or four channels. The second-type optical filter array includes a large quantity of channels, for example, may include eight or 10 channels. If the second-type optical filter array includes a large quantity of channels, it may be considered that the second-type optical filter array is configured to obtain a hyperspectral image or a multi-spectral image. In addition, if the second-type optical filter array includes a large quantity of channels, a high-resolution image needs to be obtained at high costs. It should be noted that, that the listed first-type optical filter array includes three channels or four channels and the second-type optical filter array includes eight channels or 10 channels is merely an example for description, and does not represent a limitation on a quantity of channels of the first-type optical filter array and a quantity of channels of the second-type optical filter array. The example is used for description. A smaller quantity of channels leads to lower costs of obtaining a high-resolution image, but leads to a smaller amount of included spectral information. In other words, an obtained image is a low-spectral image. A larger quantity of channels leads to higher costs of obtaining a high-resolution image, but leads to a larger amount of included spectral information. In other words, an obtained image is a hyperspectral image. Therefore, in the solution provided in this application, a first-type optical filter array including a small quantity of channels is used to obtain a high-resolution low-spectral image, to increase a resolution and reduce costs, and a second-type optical filter array including a large quantity of channels is used to obtain a low-resolution hyperspectral image, to obtain more spectral information. When data obtained by using the two optical filter arrays is fused, a high-resolution hyperspectral image may be obtained without increasing additional costs.

In a possible implementation, the high-resolution image is an image whose vertical resolution is greater than or equal to 720, and may also be referred to as a high-definition image, for example, may be 1280×720 and 1920×108. Herein, a number before a multiplication sign represents a width (namely, a horizontal resolution), and a number after the multiplication sign represents a height (namely, the vertical resolution). A low-resolution image is an image whose vertical resolution is less than 720.

In a possible implementation, the hyperspectral image may cover a part of visible light information, or the hyperspectral image may cover the entire visible light information, or the hyperspectral image may cover all the visible light information and near-infrared light information, or the hyperspectral image may cover a part of the visible light information and near-infrared light information. The low-spectral image may cover a part of the visible light information, or the low-spectral image may cover the entire visible light information, and when the hyperspectral image covers a part of the visible light information, or the hyperspectral image covers the entire visible light information, an amount of spectral information that may be covered by the low-spectral image is less than an amount of spectral information that may be covered by the hyperspectral image.

Both a high spectrum and a low spectrum are related to a quantity of channels. To be specific, the high spectrum is obtained through a large quantity of channels, and the low spectrum is obtained through a small quantity of channels. A larger quantity of channels leads to higher costs of increasing a resolution of an image, and a smaller quantity of channels leads to lower costs of increasing the resolution of the image. Therefore, it may be considered that the resolution of the image and whether a spectrum of the image is high or low are related to the quantity of channels.

In a possible implementation, the quantity of channels of the first-type optical filter array is a positive integer not greater than M, and the quantity of channels of the second-type optical filter array is a positive integer greater than M, where M is a positive integer. For example, when M is 1, the quantity of channels of the first-type optical filter array is 1, and the quantity of channels of the second-type optical filter array is a positive integer greater than 1. For example, the quantity of channels of the second-type optical filter array may be 2, 3, 8, 10, or 20. For another example, when M is 7, the quantity of channels of the first-type optical filter array is a positive integer not greater than 7, for example, may be 1, 3, 4, or 6, and the quantity of channels of the second optical filter array is a positive integer greater than 7, for example, may be 9, 10, or 30.

It should be noted that selection of the quantity of channels of the first-type optical filter array determines costs of improving the resolution of the image, and selection of the quantity of channels of the second-type optical filter array determines spectral information included in the image. The following describes the first-type optical filter array and the second-type optical filter array with reference to several preferred solutions provided in this embodiment of this application.

Figure 2:
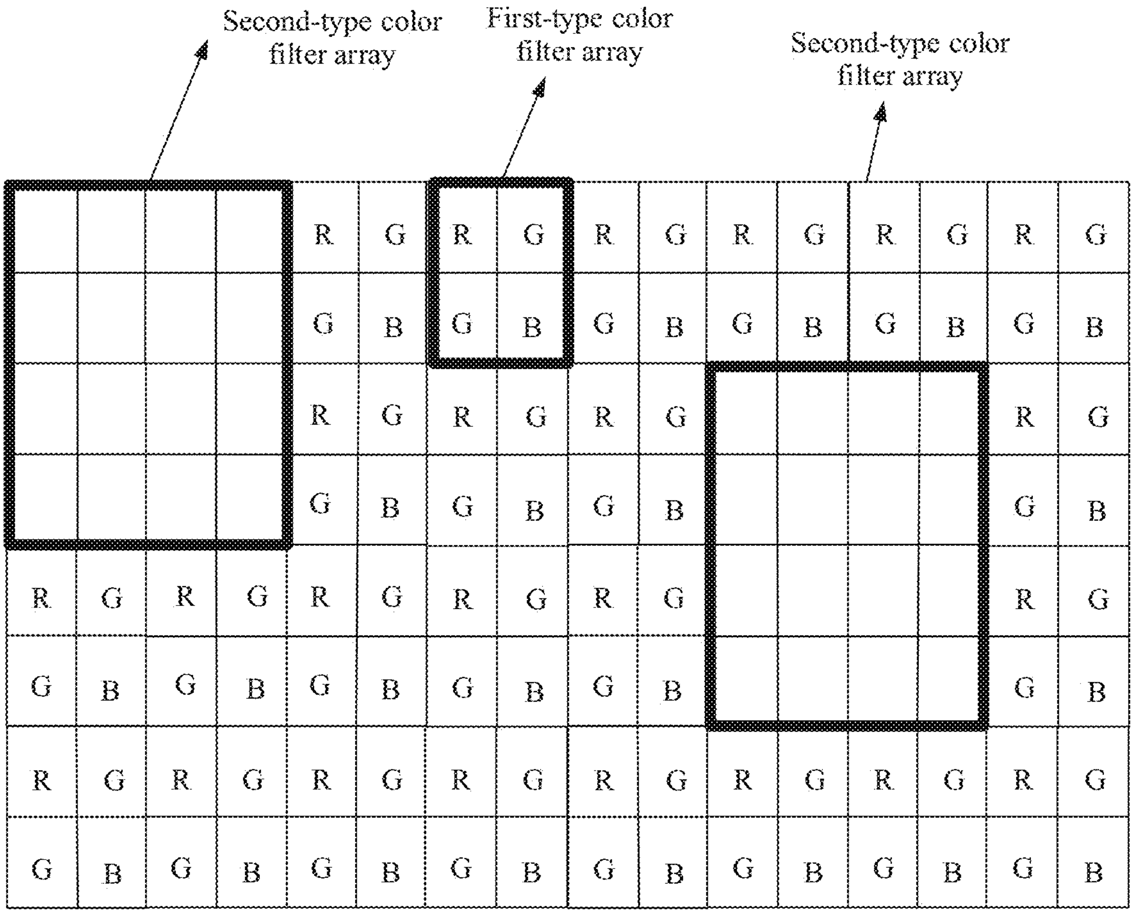
FIG. 2 is a schematic diagram of a structure of an optical filter array according to an embodiment of this application.

As shown in FIG. 2, in a implementation, the first-type optical filter array is an optical filter array including three channels. In a possible implementation, the three channels are any three channels in a red channel (red, R), a green channel (green, G), a blue channel (blue, B), a yellow channel Y, and a near-infrared channel IR. The quantity of channels of the second-type optical filter array is 4 to 25. As shown in FIG. 2, that the quantity of channels of the second-type optical filter array is 16 is used for representation. As shown in FIG. 2, all first-type optical filter arrays may be a specific type of optical filter array including three channels. For example, as shown in FIG. 2, the first-type optical filter array includes three channels, namely, RGB channels, and all the first-type optical filter array may be an optical filter array including three channels, namely, the RGB channels. Alternatively, the first-type optical filter array may include a plurality of types of optical filter arrays each including three channels. For example, the first-type optical filter array includes three channels, namely, the RGB channels and three channels, namely, RYB channels. The optical filter array provided in this application may include a first-type optical filter array including three channels, namely, the RGB channels, or may include a first-type optical filter array including three channels, namely, the RYB channels. In the optical filter array shown in FIG. 2, that each first-type optical filter array includes three channels, namely, RGB channels is used for representation. The quantity of channels of the second-type optical filter array is 16. In a possible implementation, it may be considered that each channel represents one color, and the 16 colors are different.

There may be a plurality of cases of a location relationship between the first-type optical filter array and the second-type optical filter array. In addition to several location relationships shown in this embodiment of this application, another location relationship may also exist. It should be understood that, in addition to the several location relationships shown in this embodiment of this application, the another location relationship also needs to fall within a protection scope of this embodiment of this application. As shown in FIG. 2, the optical filter array includes a plurality of groups of first-type optical filter arrays and a plurality of groups of second-type optical filter arrays, and a location relationship between the first-type optical filter array and the second-type optical filter array is that the plurality of groups of first-type optical filter arrays surround the second-type optical filter array.

Figure 3:
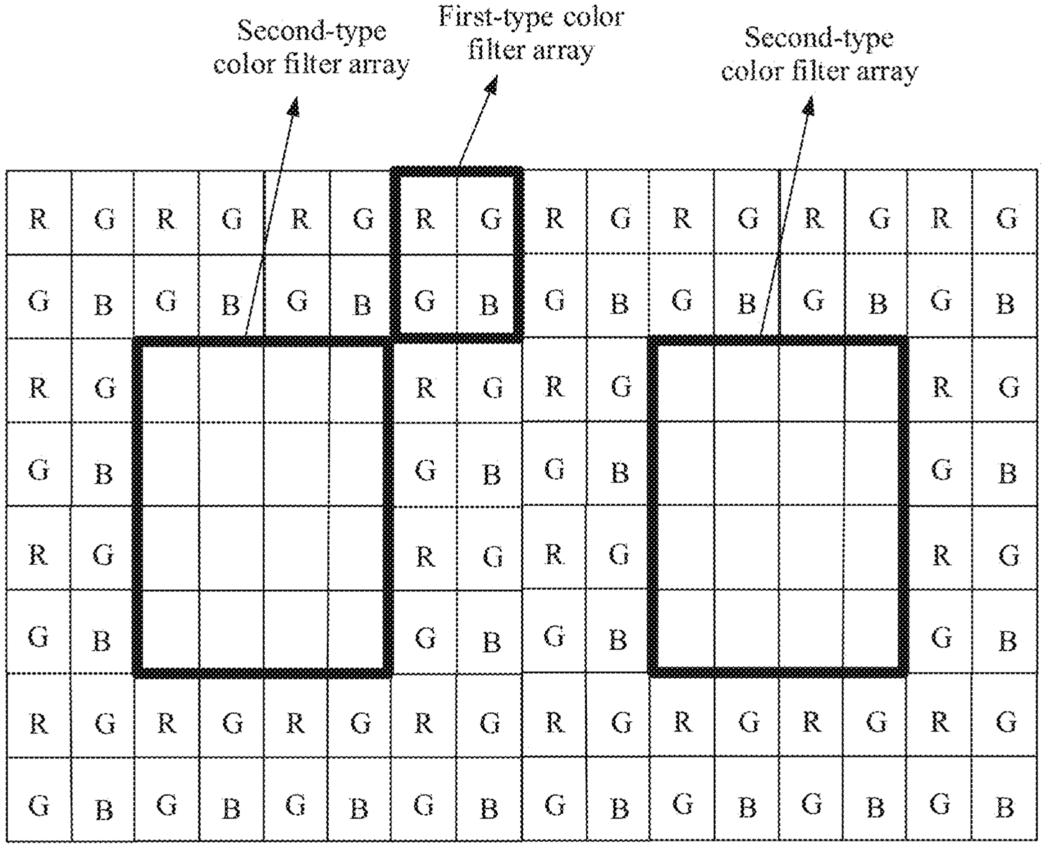
FIG. 3 is a schematic diagram of a structure of another optical filter array according to an embodiment of this application.

In a implementation, as shown in FIG. 3, the first-type optical filter array surrounds the second-type optical filter array, and a shorter distance to a center of the optical filter array leads to higher distribution density of the second-type optical filter array and lower distribution density of the first-type optical filter array. In other words, the second-type optical filter array is disposed at the center of the optical filter array, and the first-type optical filter array is disposed around the optical filter array. An advantage of this design is that photographing is usually performed by using a lens, and a photographed object is usually located at a central location of the lens. In this case, the second-type optical filter array is disposed at the central location of the optical filter array, so that spectral information included in a target object in the image can be improved.

Figure 4:
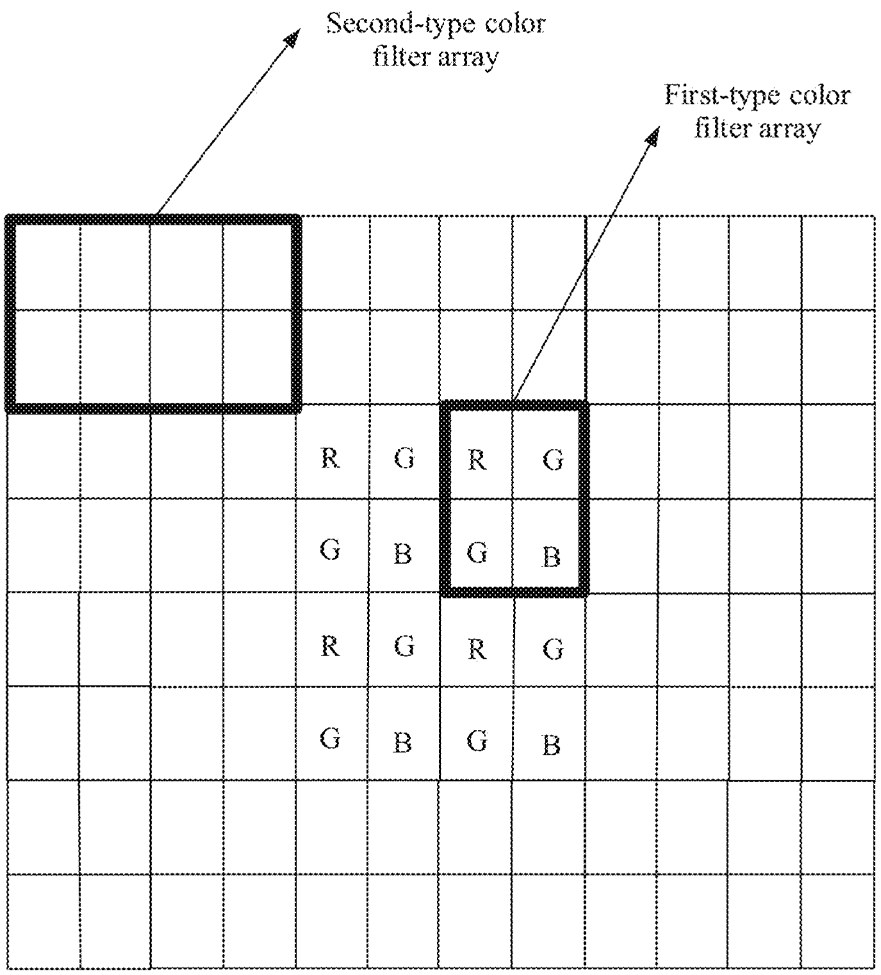
FIG. 4 is a schematic diagram of a structure of another optical filter array according to an embodiment of this application.

In a possible implementation, as shown in FIG. 4, the location relationship between the first-type optical filter array and the second-type optical filter array is that the plurality of groups of second-type optical filter arrays surround the first-type optical filter array. As shown in FIG. 4, that the first-type optical filter array includes three channels, namely, the RGB channels, and the second-type optical filter array is an optical filter array including eight channels is used for representation. In a possible implementation, a shorter distance to a center of the optical filter array leads to higher distribution density of the first-type optical filter array and lower distribution density of the second-type optical filter array. In other words, the first-type optical filter array is disposed at the center of the optical filter array, and the second-type optical filter array is disposed around the optical filter array. An advantage of this design is that photographing is usually performed by using a lens, and a photographed object is usually located at a central location of the lens. In this case, the second-type optical filter array is disposed at the central location of the optical filter array, so that an image resolution in a region of a target object in the image can be improved. It should be noted that the second-type optical filter array surrounds the first-type optical filter array may include that the second-type optical filter array half surrounds the first-type optical filter array. For example, the second-type optical filter array is located on a left side, a right side, and a lower side of the first-type optical filter array, but is not located on an upper side of the first-type optical filter array.

Figure 5:
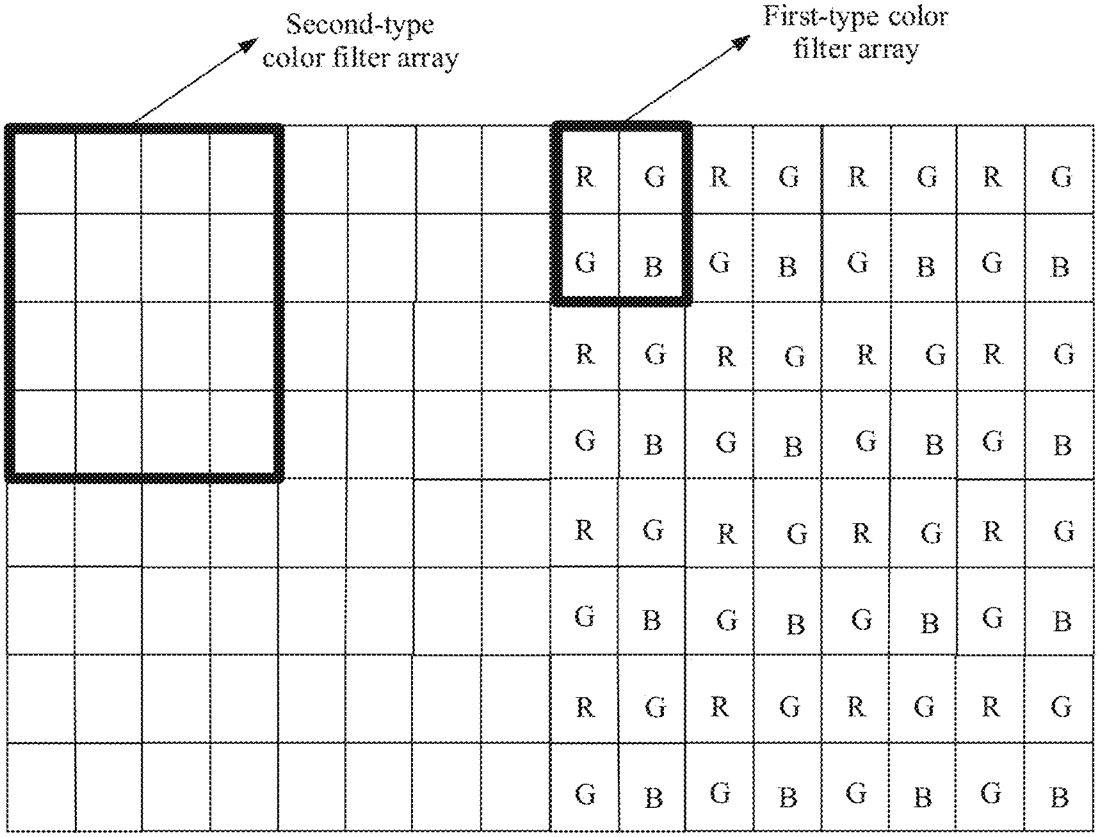
FIG. 5 is a schematic diagram of a structure of another optical filter array according to an embodiment of this application.

In a possible implementation, as shown in FIG. 5, the location relationship between the first-type optical filter array and the second-type optical filter array is that the plurality of groups of first-type optical filter arrays and the plurality of groups of second-type optical filter arrays are disposed in parallel.

Figure 6:
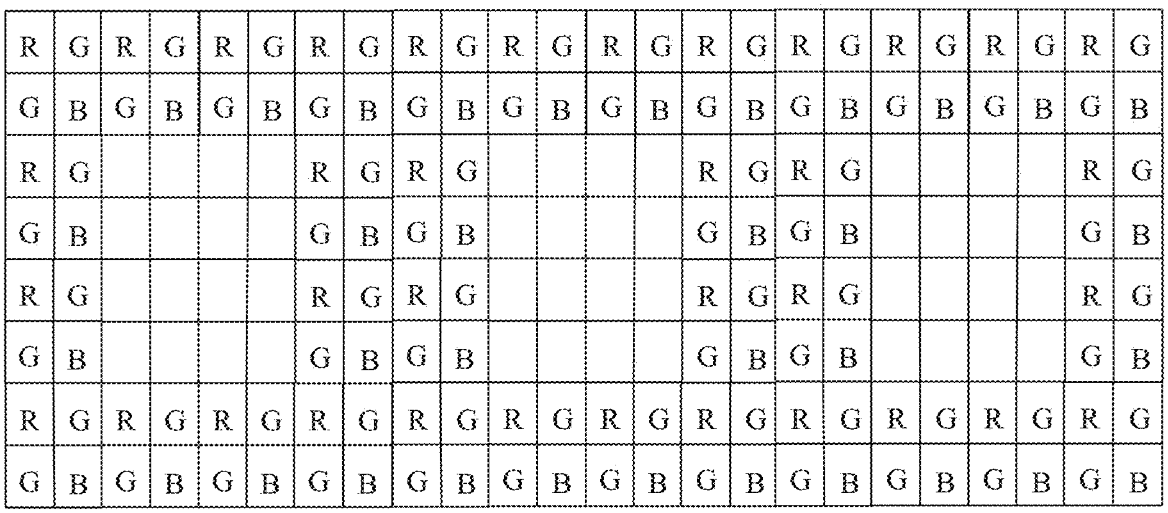
FIG. 6 is a schematic diagram of a structure of another optical filter array according to an embodiment of this application.
Figure 7:
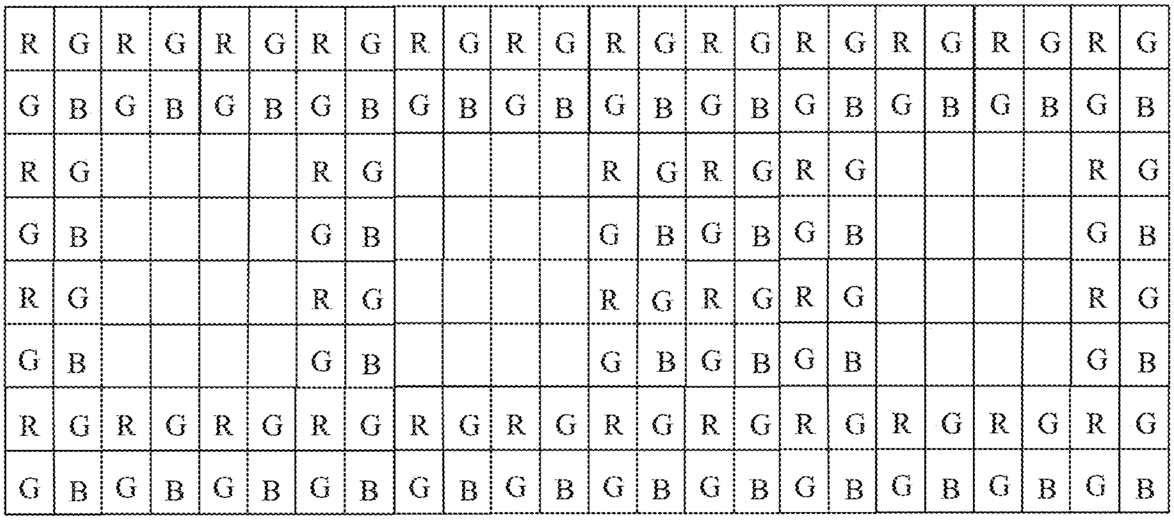
FIG. 7 is a schematic diagram of a structure of another optical filter array according to an embodiment of this application.

In a possible implementation, the second-type optical filter array is periodically distributed. For example, it may be specifically represented that any two groups of second-type optical filter arrays in the optical filter arrays are separated by a same quantity of first-type optical filter arrays. FIG. 6 is a schematic diagram of a structure in which a second-type optical filter array is periodically distributed. In a possible implementation, the second-type optical filter array may alternatively not be periodically distributed. For example, as shown in FIG. 7, it may be specifically represented that any two groups of second-type optical filter arrays in the optical filter arrays are separated by a different quantity of first-type optical filter arrays.

In a possible implementation, a total area of the plurality of groups of first-type optical filter arrays is greater than a total area of the plurality of groups of second-type optical filter arrays. In this implementation, if a total area of all first-type optical filter arrays is greater than a total area of all second-type optical filter arrays, because the total area of the first-type optical filter arrays is large, costs may be better reduced, to obtain the high-resolution hyperspectral image.

Figure 8:
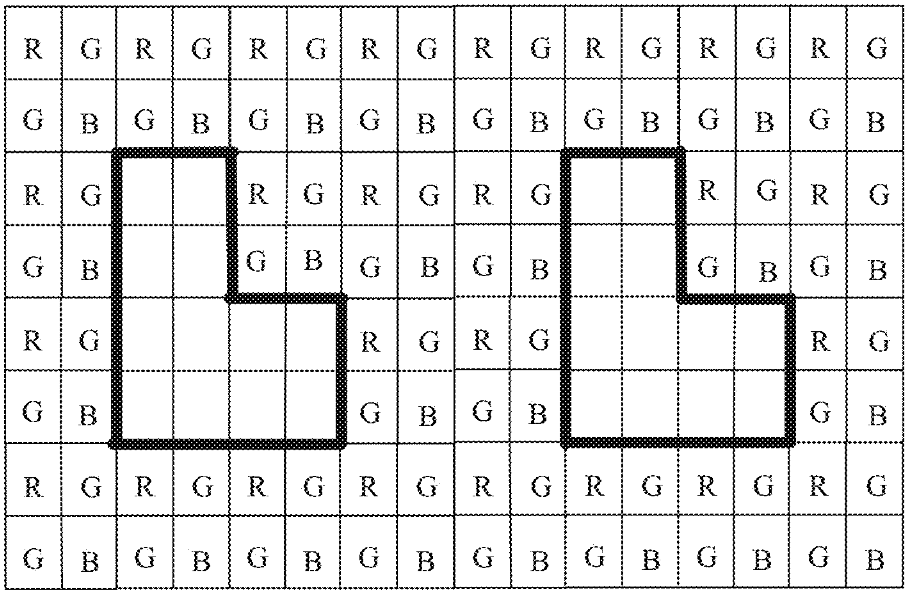
FIG. 8 is a schematic diagram of a structure of another optical filter array according to an embodiment of this application.
Figure 9:
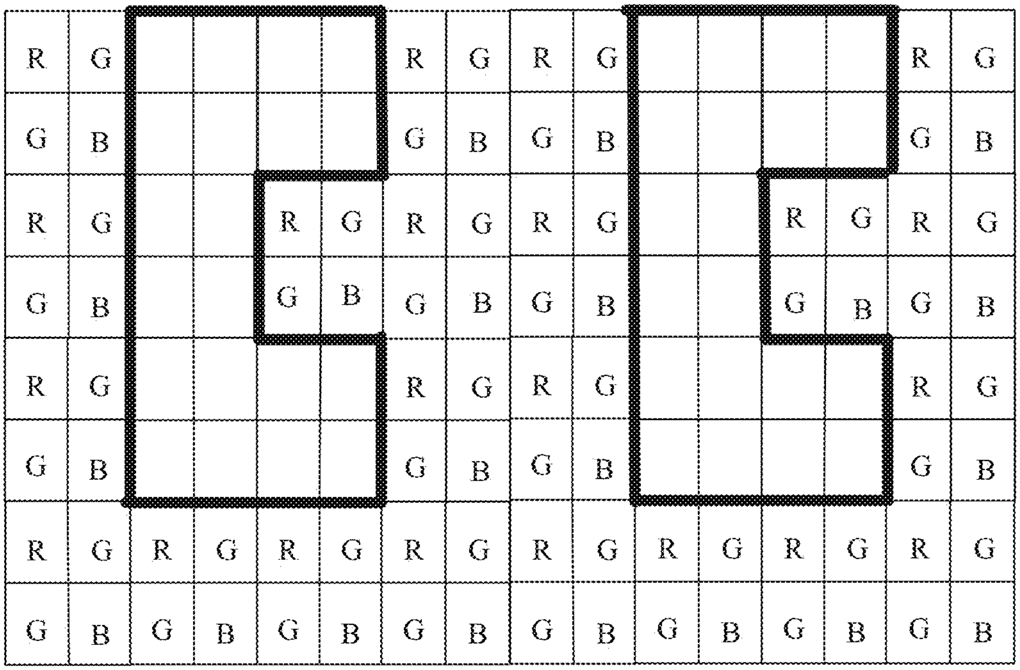
FIG. 9 is a schematic diagram of a structure of another optical filter array according to an embodiment of this application.

In the structures shown in FIG. 2 to FIG. 7, the first-type optical filter array is of a matrix structure, and is specifically described by using a 2×2 matrix structure. The second-type optical filter array is also of a matrix structure, and is specifically described by using a 4×4 matrix structure as shown in FIG. 2. It should be noted that, in addition to the case in which the first-type optical filter array is of a 2×2 matrix structure and the second-type optical filter array is a 4×4 matrix structure, there may further be another matrix structure. For example, the second-type optical filter array may alternatively be a 1×2 matrix structure, a 3×3 matrix structure, or a 5×5 matrix structure. In addition, it should be noted that, in addition to the matrix structure, the second-type optical filter array in this embodiment of this application may alternatively have another structure. For example, as shown in FIG. 8, the second-type optical filter array may be an "L"-type structure, or as shown in FIG. 9, the second-type optical filter array may be a "concave"-type structure. Certainly, in addition to several structures that are of the second-type optical filter array and that are provided in this application, the second-type optical filter array may alternatively be of another structure. For example, the second-type optical filter array may also be an "E"-type structure.

Figure 10:
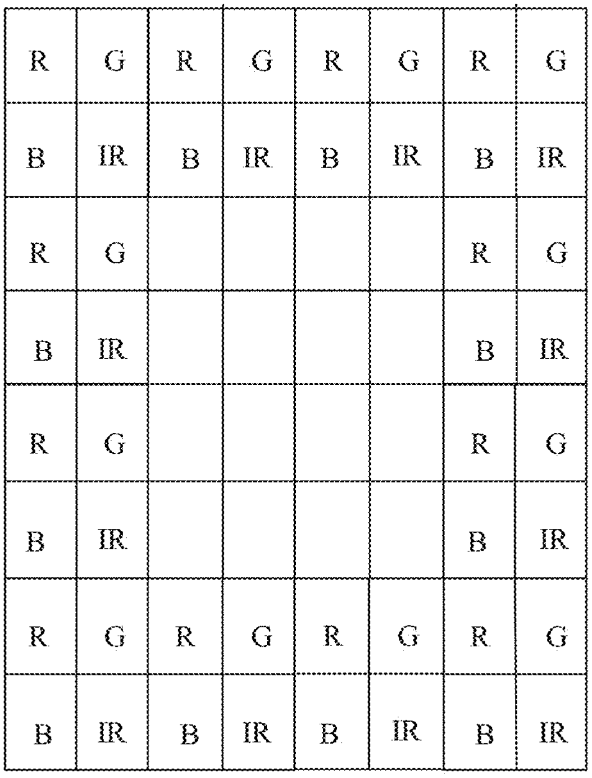
FIG. 10 is a schematic diagram of a structure of another optical filter array according to an embodiment of this application.
Figure 11:
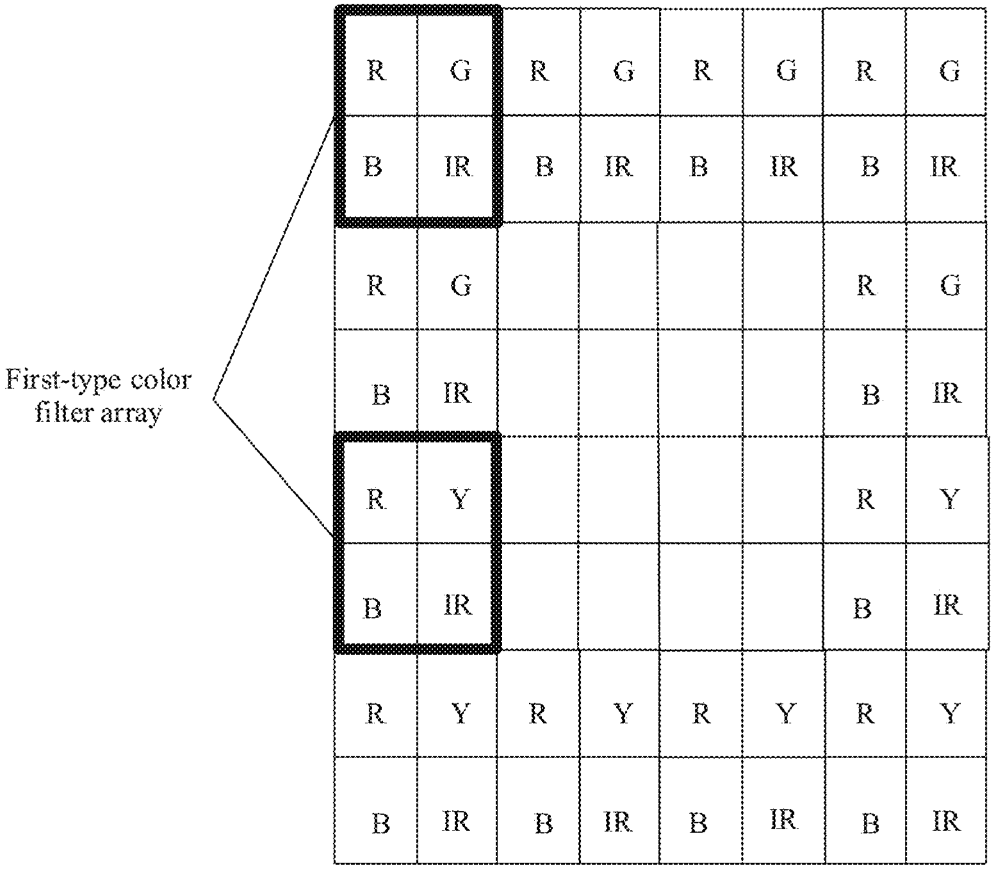
FIG. 11 is a schematic diagram of a structure of another optical filter array according to an embodiment of this application.
Figure 12:
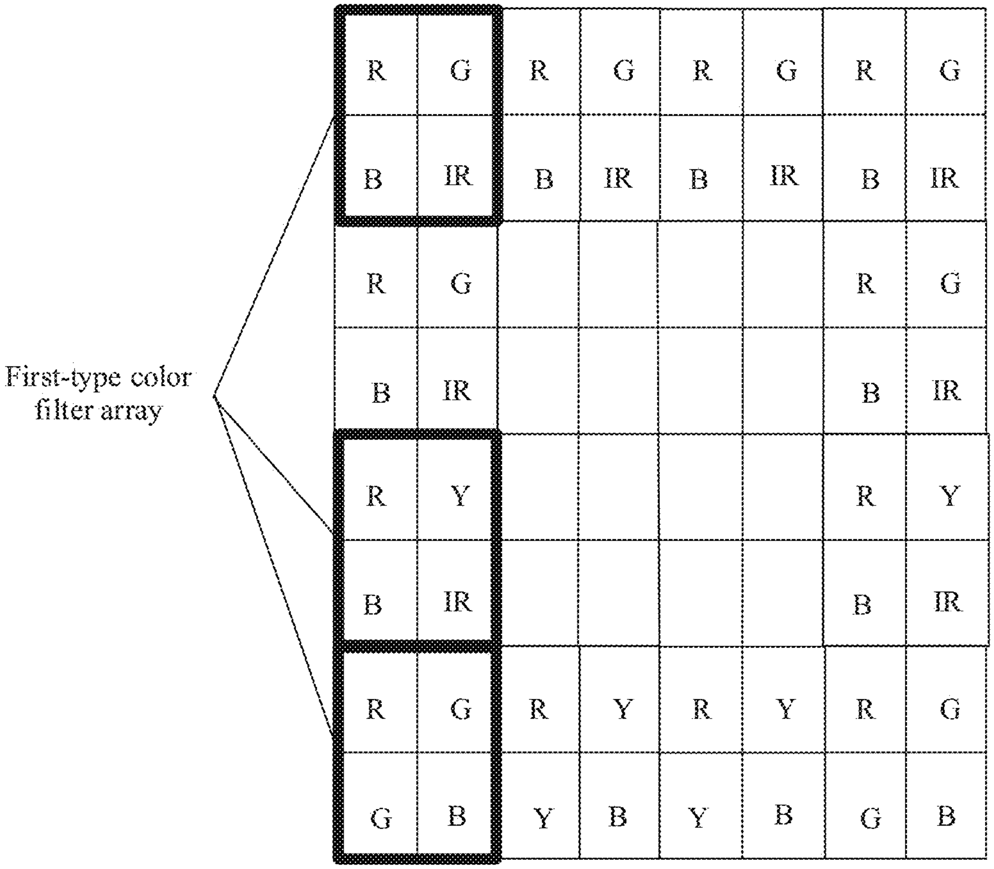
FIG. 12 is a schematic diagram of a structure of another optical filter array according to an embodiment of this application.

As shown in FIG. 10, in a implementation, the first-type optical filter array is an optical filter array including four channels. In a possible implementation, the four channels are any four channels in a red channel R, a green channel G, a blue channel B, a yellow channel Y, and a near-infrared channel IR. The quantity of channels of the second-type optical filter array is 4 to 25. As shown in FIG. 10, that the quantity of channels of the second-type optical filter array is 16 is used for representation. As shown in FIG. 10, all first-type optical filter arrays may be a specific type of optical filter array including four channels. For example, as shown in FIG. 10, the first-type optical filter array is four channels, namely, RGBIR channels. In the optical filter array shown in FIG. 10, all the first-type optical filter array may be an optical filter array including four channels, namely, the RGBIR channels. Alternatively, the first-type optical filter array may include a plurality of types of optical filter arrays each including four channels. For example, as shown in FIG. 11, the first-type optical filter array includes four channels, namely, the RGBIR channels and four channels, namely, RYBIR channels. The optical filter array provided in this application may include a first-type optical filter array including four channels, namely, the RGBIR channels, or may include a first-type optical filter array including four channels, namely, the RYBIR channels. In a possible implementation, the optical filter array may include an optical filter array including three channels and an optical filter array including four channels. For example, as shown in FIG. 12, the optical filter array includes both the optical filter array including three channels and the optical filter array including four channels. When the first-type optical filter array includes the optical filter array including four channels, a structure of the second-type optical filter array and a location relationship between a first optical filter array and a second optical filter array may be understood with reference to the case in which the first-type optical filter array includes the optical filter array including three channels. Details are not described again in this embodiment of this application.

Figure 13:
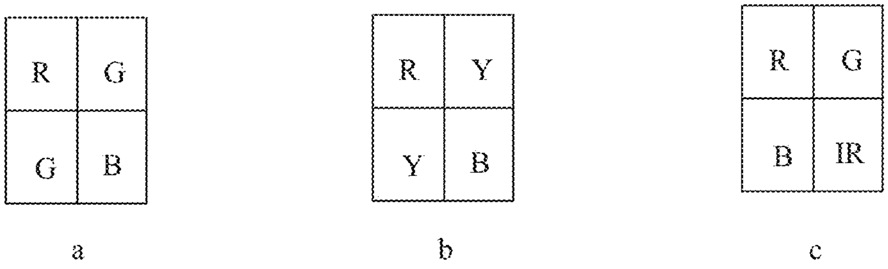
FIG. 13 is a schematic diagram of a structure in which a first-type array includes three channels or four channels according to an embodiment of this application.

In FIG. 13, a to c are schematic diagrams of several typical structures in which a first-type optical filter array includes 3 channels or 4 channels.

The foregoing mainly describes a first design manner provided in this application. That is, in the first design manner, the quantity of channels included in the second-type color filter array is greater than the quantity of channels included in the first-type color filter array, the low-resolution hyperspectral image may be obtained by using the second-type color filter array, the high-resolution low-spectral image is obtained by using the first-type color filter array, and the data obtained by using the first-type color filter array and the data obtained by using the second-type color filter array are fused, to obtain the high-resolution hyperspectral image. It should be noted that, in a second design manner provided in this application, the quantity of channels included in the second-type color filter array may be less than the quantity of channels included in the first-type color filter array, or the quantity of channels included in the second-type color filter array may be the same as the quantity of channels included in the first-type color filter array, and the spectral information covered by the second-type color filter array may supplement the spectral information covered by the first-type color filter array, the data obtained by using the first-type color filter array and the data obtained by using the second-type color filter array may be fused by using a related algorithm, to obtain the high-resolution hyperspectral image. In the second design manner, in addition to a limitation on the quantity of channels, the location relationship between the first-type optical filter array and the second-type optical filter array may be understood with reference to the location relationship between the first-type optical filter array and the second-type optical filter array in the first design manner. Details are not described herein again.

It should be noted that the optical filter array provided in this application may include any one of the structures described in FIG. 2 to FIG. 12, or may include any combination of a plurality of structures in the structures described in FIG. 2 to FIG. 12. For example, the optical filter array provided in this application may include both the structure described in FIG. 3 and the structure described in FIG. 4.

The foregoing mainly describes the quantity of channels of the first-type optical filter array, the quantity of channels of the second-type optical filter array, the location relationship between the first-type optical filter array and the second-type optical filter array, a structure of the first-type optical filter array, and the structure of the second-type optical filter array. The following describes specific structures of the first-type optical filter array and the second-type optical filter array.

Figure 14:
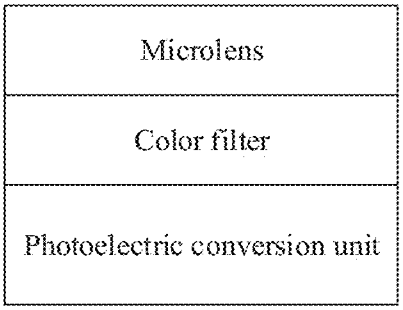
FIG. 14 is a schematic diagram of a structure of a first-type optical filter array or a second-type optical filter array according to an embodiment of this application.
Figure 15:
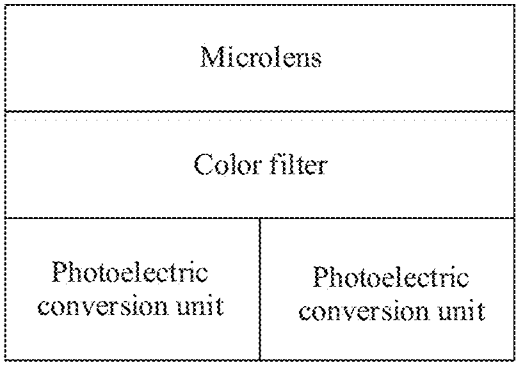
FIG. 15 is a schematic diagram of a structure of a first-type optical filter array or a second-type optical filter array according to an embodiment of this application.
Figure 16:
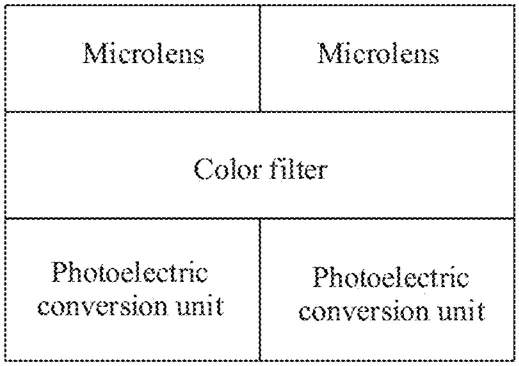
FIG. 16 is a schematic diagram of a structure of a first-type optical filter array or a second-type optical filter array according to an embodiment of this application.

In a possible implementation, the first-type optical filter array includes a color filter, a microlens, and a photoelectric conversion unit, the photoelectric conversion unit is configured to convert an optical signal into an electrical signal, the color filter is located between the microlens and the photoelectric conversion unit, and for one first-type optical filter array, one microlens corresponds to one color filter and corresponds to one photoelectric conversion unit, or one microlens corresponds to one color filter and corresponds to a plurality of photoelectric conversion units, or one color filter corresponds to a plurality of microlenses and corresponds to a plurality of photoelectric conversion units. The following provides descriptions with reference to FIG. 14 to FIG. 16. As shown in FIG. 14, the color filter is disposed above the photoelectric conversion unit, the microlens is disposed above the color filter, and the microlens, the color filter, and the photoelectric conversion unit are in a one-to-one correspondence. In other words, one color filter is disposed above one photoelectric conversion unit, and one microlens is disposed above one color filter. A purpose and a function of the microlens is to increase light energy received by the photoelectric conversion unit. The light energy may also be referred to as a quantity of photons in the micro field. Limited by a structure, each photoelectric conversion unit cannot be seamlessly connected to another photoelectric conversion unit. Consequently, a large photosensitive area is lost on an entire sensor. Light received on an entire surface is converged on one photoelectric conversion unit by using the microlens, to greatly improve light utilization efficiency. As shown in FIG. 15, one color filter is disposed above the plurality of photoelectric conversion units. In a implementation, one color filter is disposed above every two photoelectric conversion units, and one microlens is disposed above each color filter. As shown in FIG. 16, one color filter is disposed above the plurality of photoelectric conversion units. In a implementation, one color filter is disposed above every two photoelectric conversion units, and a plurality of microlenses are disposed above each color filter. In a implementation, two microlenses are disposed above each color filter.

In a possible implementation, the second-type optical filter array includes a color filter, a microlens, and a photoelectric conversion unit, the photoelectric conversion unit is configured to convert an optical signal into an electrical signal, the color filter is located between the microlens and the photoelectric conversion unit, and for one second-type optical filter array, one microlens corresponds to one color filter and corresponds to one photoelectric conversion unit, or one microlens corresponds to one color filter and corresponds to a plurality of photoelectric conversion units, or one color filter corresponds to a plurality of microlenses and corresponds to a plurality of photoelectric conversion units. The second-type optical filter array may be understood with reference to FIG. 14 to FIG. 16. Details are not described herein again.

Figure 17:
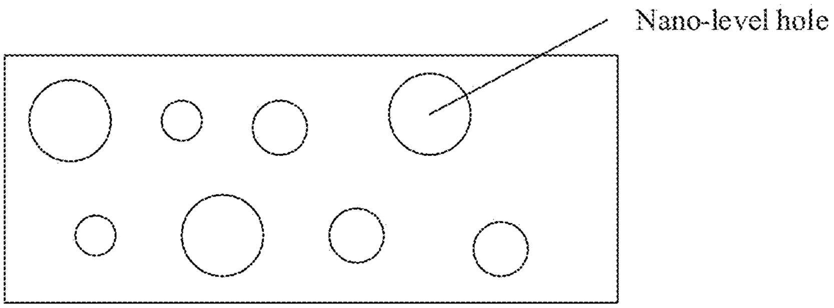
FIG. 17 is a schematic diagram of a structure of a color filter.
Figure 18:
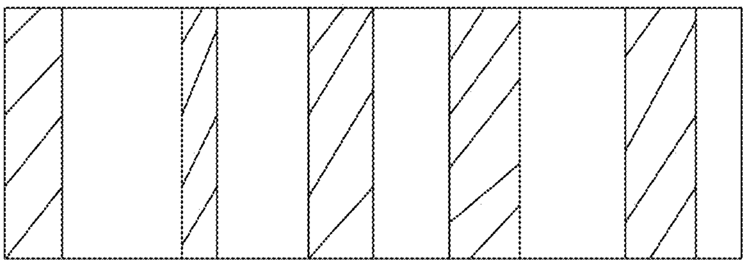
FIG. 18 is a schematic diagram of another structure of a color filter.
Figure 19:
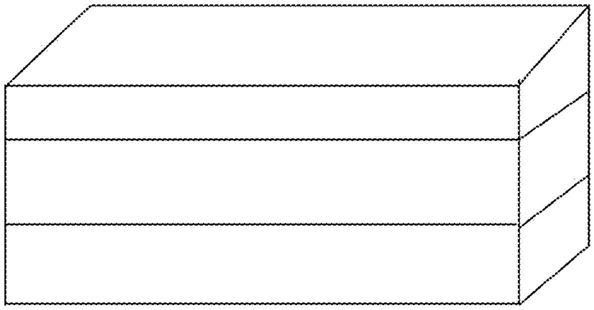
FIG. 19 is a schematic diagram of another structure of a color filter.

The color filter is sometimes referred to as an optical filter, and is an optical device used to select a desired radiation band. In a possible implementation, the color filter is made of a chemical dyeing material. For example, the optical filter is made by adding a special dye to a plastic or glass sheet, and a red optical filter can allow only red light to pass, and so on. Transmissivity of the glass sheet is originally similar to that of air, and all colored light can pass through. Therefore, the glass sheet is transparent. However, after the glass sheet is dyed, a molecular structure changes, a refractive index changes, and some colored light that can pass changes. For example, if a beam of white light passes through a blue optical filter, a beam of blue light is emitted, but green light and red light are rare, and most light is absorbed by the optical filter. In a possible implementation, the color filter is made of structural optics. For example, the color filter may be of a nano-hole structure, may be of a waveguide grating structure, or may be of a multilayer interference film structure. Any structure that may implement a color filter function may be used in this embodiment of this application. For example, the color filter may alternatively be of an FP cavity (fabry-perot cavity) structure. The FP cavity is an apparatus that operates based on a multi-beam interference phenomenon. To better understand the color filter made of structural optics, the following provides example descriptions with reference to FIG. 17 to FIG. 19. FIG. 17 is a schematic diagram of a structure of a color filter of the nano-hole structure. Interference of surface plasmon polaritons of adjacent holes is used to trigger selective transmission of light. For a nano-hole type, different optical filters are designed by adjusting a size of a nano-hole processed by using a metal material and a spacing between nano-holes. FIG. 18 shows a color filter of the waveguide grating structure. A surface plasmon metal is introduced into a micro-nano grating structure, to superimpose functions such as absorption and scattering of a surface plasmon onto a micro-nano grating based on optical diffraction. A micro-nano periodic grating structure can be used as a dispersion medium to select a band. Parameters such as a period and a duty ratio of a grating structure are changed, to control characteristics such as absorption, scattering, diffraction, and polarization of light, and implement a filtering characteristic. FIG. 19 shows a color filter of the multilayer interference film structure. In this structure, there may be two types of filter structures based on a main physical mechanism for causing optical filtering: a localized surface plasmon resonance-based metal insulator metal (metal insulator metal, MIM) filter structure and a multi-beam interference-based fabry-perot (fabry-perot, FP) filter structure. A metal at a top layer of the MIM filter structure usually has a micro-nano structure. Localized surface plasmon resonance of the top layer and anti-parallel surface currents at upper and lower layers of metal act together, so that the MIM structure absorbs light of a specific band, to implement a filter function. In the FP filter structure, two semi-permeable semi-reflective films form a reflective layer, and an intermediate cut-off layer forms a resonator, so that light with constructive interference is transmitted or reflected based on multi-beam interference. In this mode, a nanostructure at the top layer is not required, and only optical performance and a manufacturing process of each film layer are usually considered.

The high-resolution low-spectral image and the low-resolution hyperspectral image may be obtained by using the optical filter array provided in this embodiment of this application, and fusion processing is performed on the high-resolution low-spectral image and the low-resolution hyperspectral image, to obtain the high-resolution hyperspectral image. According to the solution provided in this application, imaging does not need to be performed for a plurality of times, and the high-resolution hyperspectral image can be obtained by performing imaging for only one time.

It should be noted that there may be different image processing processes for different integrated signal processors (integrated signal processor, ISP). The following describes, by using one processing process as an example, how to obtain the high-resolution low-spectral image and the low-resolution hyperspectral image. It should be understood that a process of obtaining the high-resolution low-spectral image and a process of obtaining the low-resolution hyperspectral image are similar, and the high-resolution low-spectral image and the low-resolution hyperspectral image are collectively referred to as an image below.

The ISP is hardware that is specifically used to process a photosensitive element signal and generate a final image. The ISP is usually used as a module, and is integrated into a system on chip. Various processing that is to be described next is performed on the ISP.

Light enters the lens and arrives at a sensor with the optical filter array provided in this embodiment of this application, to obtain a most original electrical signal. Illumination estimation, demosaicing processing, and denoising are performed on the signal, to obtain a picture in a raw format. Then, white balance processing, or the like is performed on the image, to obtain an image. The illuminance estimation is performed, so that the signal meets a preset standard (international standardization organization, ISO). For example, the standard may be a standard of light sensitivity of a camera. To achieve light sensitivity corresponding to a setting, the camera brings a gain in a received signal. The demosaicing processing may be understood with reference to the demosaicing processing mentioned in the descriptions of the Bayer array. Details are not described herein again. There are many denoising manners. For example, noise is usually loud. Therefore, the noise may be reduced by using a blur. However, the blur also affects a detail. Therefore, it is considered to remove some regions with a strong signal, to restore the image. A color deviation may be corrected through white balance processing. For example, the first-type optical filter array is RGB channels. White balance is to correct points (a white point) with equal RGB components, and correction may be implemented by separately scaling the three channels up/down. The white balance processing is to adjust a color circuit inside the camera under different color temperature conditions, so that a captured image is used to offset the color deviation, which is closer to a visual habit of a human eye. White balance may also be simply understood as that, under any color temperature condition, a standard white color photographed by the camera is adjusted by using the circuit, so that the standard white color remains white after imaging. It should be noted that the process is merely an example description, and more steps may be included in an actual application scenario. In the method, the data obtained by the first-type optical filter array is processed, the data obtained by the second-type optical filter array is processed, and processed data is fused, to obtain the high-resolution hyperspectral image. For example, the following provides a method for fusing the processed data, to obtain the high-resolution hyperspectral image.

It may be considered that the multispectral image is obtained by blurring and downsampling a to-be-reconstructed spectral image, and it may be considered that the low-spectral image is obtained by performing spectral downsampling on the to-be-reconstructed spectral image. Therefore, a fusion problem of the spectral image may also be considered to reconstruct a spectral image existing before degradation by using two degraded spectral images. An observed multispectral image Yh may be considered as blurring, downsampling, and noising data of a to-be-reconstructed image Z. An observed low-spectral image Ym may be considered as downsampling and noising data of the to-be-reconstructed image Z. Therefore, a spectral image degradation model connecting Z and Yh and Ym can be expressed as:

$$Ym=RZ+Nm$$

$$Yh=ZBM+Nh$$

Herein, Nm and Nh represent Gaussian noise.

A spectral downsampling matrix R and a spatial blur matrix B are preset. In an actual application, a method such as spectral decomposition may be used to estimate the spectral downsampling matrix and the spatial blur matrix, to obtain the high-resolution hyperspectral image.

The spectral decomposition is introduced into spectral fusion because the spectral decomposition can be used to decompose the spectral image into a form of multiplication of two low-dimensional matrices. The spectral decomposition is to decompose each pixel in the spectral image into a series of component spectral features, which are referred to as an endmember (endmembers) and an abundance coefficient (abundance). The endmember is usually assumed to be pure matter in the image, and the abundance coefficient of each pixel indicates a ratio of different matter in the pixel.

The to-be-reconstructed spectral image Z may be expressed as:

$$Z=EX$$

Herein, $E \in R^{\lambda} h^{n_s}$ represents an endmember matrix, and is equivalent to the spectral information, $n_s$ represents a quantity of endmembers or represents a subspace dimension, and $\lambda_h$ indicates a spectral band of the multispectral image.

Herein, $X \in R^{n_s n_m}$ represents an abundance matrix, and equivalent to spatial information. Herein, each column vector represents endmember information of one pixel in the to-be-reconstructed spectral image Z. A value of $n_s$ is usually small, indicating that E and X are in low-dimensional space. Therefore, there are the following formulas:

$$Ym=RZ+Nm \approx EmX$$

$$Yh=ZBM+Nh \approx EXh$$

Herein, $E_m \in R^{\lambda_m n_s}$ represents a spectral-degradation endmember matrix, and $X_h \in R^{n_s n_h}$ represents a spatial-degradation abundance matrix. It is clear that Xh=XBM and Em=RE. Herein, $\lambda_m$ represents a low-spectral band.

The to-be-reconstructed spectral image Z is a linear combination of the endmember matrix E representing the spectral information and the abundance matrix X representing the spatial information. Further, the observed multispectral image has a high spatial resolution, and the observed hyperspectral image has a hyperspectral resolution. Therefore, when a spectral image with a high spatial resolution and a hyperspectral resolution, two linear optimization models are used to respectively extract the abundance matrix of the multispectral image and the endmember matrix of the hyperspectral image.

For the extracted abundance matrix X of the multispectral image Ym, the following linear optimization model is established:

$$X := \underset{X}{\operatorname{argmin}} \|Y_m - E_m X\|_F^2$$

Herein, $\| \|_F$ represents a frobenius norm. Similarly, when the endmember matrix E of the hyperspectral image Yh is extracted, the following linear optimization model is established:

$$E := \underset{E}{\operatorname{argmin}} \|Y_h - E X_h\|_F^2$$

Therefore, reconstruction of the spectral image Z with the high spatial resolution and the hyperspectral resolution is converted into resolution to the two linear optimization models.

For the first design provided in this application, in the present invention, the image obtained by using the first-type optical filter array is used as the low-spectral image Ym, the image obtained by using the second-type optical filter array is used as the multispectral image Yh, and the high-resolution multispectral image is obtained by using the method in the solution and an algorithm.

For the second design provided in this application, in the present invention, the image obtained by using the first-type optical filter array is used as the low-spectral image Ym, an image jointly obtained by the second-type optical filter array and a group of first-type optical filter arrays adjacent to the second-type optical filter array is used as the multispectral image Yh, and the high-resolution multispectral image is obtained by using the method in the solution and an algorithm.

This application further provides an electronic device. The electronic device may include a lens, a lens mount, and an optical filter array, the lens is mounted on the lens mount, and the lens mount is disposed between the optical filter array and the lens. The optical filter array is the optical filter array described in embodiments of this application. The electronic device provided in this application may be any device on which the optical filter array needs to be installed, for example, a mobile terminal, an intelligent vehicle, or a monitoring device.

Figure 20:
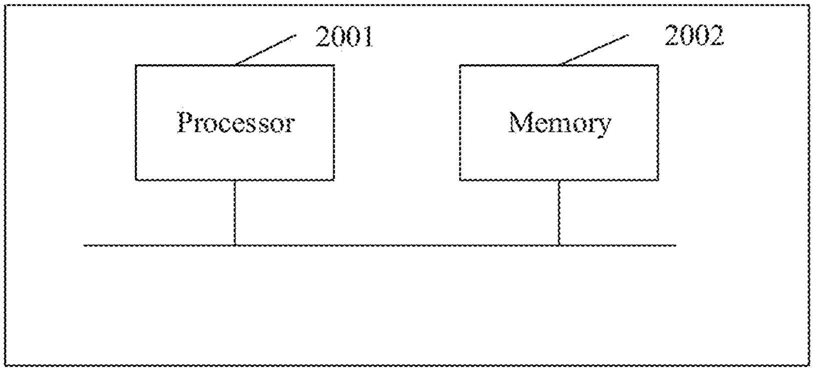
FIG. 20 is a schematic diagram of a structure of an electronic device according to an embodiment of this application.

The electronic device provided in this application may be implemented by using a communication device in FIG. 20. FIG. 20 is a schematic diagram of a hardware structure of a communication device according to an embodiment of this application. The communication device includes a processor 2001 and a memory 2002.

The processor 2001 includes but is not limited to one or more of a central processing unit (central processing unit, CPU), a network processor (network processor, NP), an application-specific integrated circuit (application-specific integrated circuit, ASIC), or a programmable logic device (programmable logic device, PLD). The PLD may be a complex programmable logic device (complex programmable logic device, CPLD), a field-programmable gate array (field-programmable gate array, FPGA), generic array logic (generic array logic, GAL), or any combination thereof.

The memory 2002 may be a read-only memory (read-only memory, ROM) or another type of static storage device that can store static information and instructions, a random access memory (random access memory, RAM) or another type of dynamic storage device that can store information and instructions, or may be an electrically erasable programmable read-only memory (electrically erasable programmable read-only memory, EEPROM), a compact disc read-only memory (compact disc read-only memory, CD-ROM) or another compact disc storage, an optical disc storage (including compact optical disc, a laser disc, an optical disc, a digital versatile disc, a Blu-ray disc, or the like), a magnetic disk storage medium or another magnetic storage device, or any other medium that can be used to carry or store expected program code in a form of instructions or a data structure and that can be accessed to a computer, but is not limited thereto. The memory may exist independently, and is connected to the processor 2001 through a communication line. Alternatively, the memory 2002 may be integrated with the processor 2001. If the memory 2002 and the processor 2001 are mutually independent devices, the memory 2002 is connected to the processor 2001. For example, the memory 2002 and the processor 2001 may communicate with each other by using the communication line.

In a possible implementation, the electronic device may be an intelligent vehicle. The intelligent vehicle may include a processor and a memory, the processor and the memory are coupled, the memory stores program instructions related to image processing, and when the program instructions stored in the memory are executed by the processor, illumination intensity estimation, white balance processing, and demosaicing processing are performed on an image obtained by a first-type optical filter array, to obtain a high-resolution low-spectral image; illumination intensity estimation, white balance processing, and demosaicing processing are performed on an image obtained by a second-type optical filter array, to obtain a low-resolution hyperspectral image; and fusion processing is performed on the high-resolution low-spectral image and the low-resolution hyperspectral image, to obtain a high-resolution hyperspectral image.

In a possible implementation, the electronic device may be a monitoring device. The monitoring device may include a processor and a memory, the processor and the memory are coupled, the memory stores program instructions related to image processing, and when the program instructions stored in the memory are executed by the processor, illumination intensity estimation, white balance processing, and demosaicing processing are performed on an image obtained by a first-type optical filter array, to obtain a high-resolution low-spectral image; illumination intensity estimation, white balance processing, and demosaicing processing are performed on an image obtained by a second-type optical filter array, to obtain a low-resolution hyperspectral image; and fusion processing is performed on the high-resolution low-spectral image and the low-resolution hyperspectral image, to obtain a high-resolution hyperspectral image.

In a possible implementation, the electronic device may be a mobile terminal. The mobile terminal may include a processor and a memory, the processor and the memory are coupled, the memory stores program instructions related to image processing, and when the program instructions stored in the memory are executed by the processor, illumination intensity estimation, white balance processing, and demosaicing processing are performed on an image obtained by a first-type optical filter array, to obtain a high-resolution low-spectral image; illumination intensity estimation, white balance processing, and demosaicing processing are performed on an image obtained by a second-type optical filter array, to obtain a low-resolution hyperspectral image; and fusion processing is performed on the high-resolution low-spectral image and the low-resolution hyperspectral image, to obtain a high-resolution hyperspectral image.

The foregoing descriptions are merely optional embodiments of this application, but are not intended to limit this application. Any modification, equivalent replacement, or improvement made without departing from the principle of this application should fall within the protection scope of this application.

What is claimed is:

1. An optical filter array, comprising a first-type optical filter array and a second-type optical filter array, wherein:

the first-type optical filter array comprises spectral information of a first band range, the second-type optical filter array comprises spectral information of a second band range, and the spectral information of the second band range is different from the spectral information of the first band range, or the spectral information of the second band range and the spectral information of the first band range overlap within a preset band range;

the first-type optical filter array comprises a first sub-type optical filter array and a second sub-type optical filter array, the first sub-type optical filter array and the second sub-type optical filter array have the same quantity of channels, spectral information of band range of the first sub-type optical filter array is different from spectral information of band range of the second sub-type optical filter array, and each of the first sub-type optical filter array and the second sub-type optical filter array comprises at least three distinct channels; and a quantity of distinct channels of the second-type optical filter array is greater than a quantity of distinct channels of the first-type optical filter array.

2. The optical filter array according to claim 1, wherein the first-type optical filter array comprises three channels, and each of the three channels represents one type of spectral information within the first band range.

3. The optical filter array according to claim 2, wherein the three channels are any three channels in a red channel R, a green channel G, a blue channel B, a yellow channel Y, and a near-infrared channel IR.

4. The optical filter array according to claim 1, wherein a quantity of channels comprised in the second-type optical filter array is a positive integer greater than 3, and one channel comprised in the second-type optical filter array represents one type of spectral information within the second band range.

5. The optical filter array according to claim 3, wherein the three channels are any one channel in an RGB channel, an RYB channel, or an RBGIR channel.

6. The optical filter array according to claim 1, wherein a quantity of channels of the second-type optical filter array is a positive integer greater than or equal to 4, and wherein the first-type optical filter array comprises four channels, or the first-type optical filter array comprises an optical filter array comprising three channels and an optical filter array comprising four channels.

7. The optical filter array according to claim 6, wherein the four channels are any four channels in a red channel R, a green channel G, a blue channel B, a yellow channel Y, and a near-infrared channel IR.

8. The optical filter array according to claim 6, wherein a quantity of channels of the second-type optical filter array is not greater than 25, and one channel comprised in the second-type optical filter array represents one type of spectral information within the second band range.

9. The optical filter array according to claim 1, wherein the first-type optical filter array and the second-type optical filter array each comprises a matrix structure.

10. The optical filter array according to claim 1, wherein the optical filter array comprises a plurality of groups of first-type optical filter arrays and a plurality of groups of second-type optical filter arrays, and the plurality of groups of first-type optical filter arrays surround the plurality of groups of second-type optical filter arrays.

11. The optical filter array according to claim 10, wherein a shorter distance to a center of the optical filter array leads to higher distribution density of the second-type optical filter array and lower distribution density of the first-type optical filter array.

12. The optical filter array according to claim 1, wherein the optical filter array comprises a plurality of groups of first-type optical filter arrays and a plurality of groups of second-type optical filter arrays, and the plurality of groups of second-type optical filter arrays surround the plurality of groups of first-type optical filter arrays.

13. The optical filter array according to claim 1, wherein the optical filter array comprises a plurality of groups of first-type optical filter arrays and a plurality of groups of second-type optical filter arrays, and the plurality of groups of first-type optical filter arrays and the plurality of groups of second-type optical filter arrays are disposed in parallel.

14. The optical filter array according to claim 10, wherein in the optical filter array, the second-type optical filter array is periodically distributed or aperiodically distributed.

15. The optical filter array according to claim 10, wherein a total area of the plurality of groups of first-type optical filter arrays is greater than a total area of the plurality of groups of second-type optical filter arrays.

16. The optical filter array according to claim 1, wherein the first-type optical filter array comprises a color filter, a microlens, and a photoelectric conversion circuit, the photoelectric conversion circuit is configured to convert an optical signal into an electrical signal, the color filter is located between the microlens and the photoelectric conversion circuit, and for one first-type optical filter array, one microlens corresponds to one color filter and corresponds to one photoelectric conversion circuit, or one microlens corresponds to one color filter and corresponds to a plurality of photoelectric conversion circuits, or one color filter corresponds to a plurality of microlenses and corresponds to a plurality of photoelectric conversion circuits.

17. The optical filter array according to claim 1, wherein the second-type optical filter array comprises a color filter, a microlens, and a photoelectric conversion circuit, the photoelectric conversion circuit is configured to convert an optical signal into an electrical signal, the color filter is located between the microlens and the photoelectric conversion circuit, and for one second-type optical filter array, one microlens corresponds to one color filter and corresponds to one photoelectric conversion circuit, or one microlens corresponds to one color filter and corresponds to a plurality of photoelectric conversion circuits, or one color filter corresponds to a plurality of microlenses and corresponds to a plurality of photoelectric conversion circuits.

18. A camera module, wherein the camera module comprises a base and an optical filter array, the optical filter array is mounted on the base, and the optical filter array comprises a first-type optical filter array and a second-type optical filter array, wherein;

the first-type optical filter array comprises spectral information of a first band range, the second-type optical filter array comprises spectral information of a second band range, and the spectral information of the second band range is different from the spectral information of the first band range, or the spectral information of the second band range and the spectral information of the first band range overlap within a preset band range;

the first-type optical filter array comprises a first sub-type optical filter array and a second sub-type optical filter array, the first sub-type optical filter array and the second sub-type optical filter array have the same quantity of channels, spectral information of band range of the first sub-type optical filter array is different from spectral information of band range of the second sub-type optical filter array, and each of the first sub-type optical filter array and the second sub-type optical filter array comprises at least three distinct channels; and a quantity of distinct channels of the second-type optical filter array is greater than a quantity of distinct channels of the first-type optical filter array.

19. An electronic device, wherein the electronic device comprises a lens, a lens mount, and an optical filter array, the lens is mounted on the lens mount, the lens mount is disposed between the optical filter array and the lens, and the optical filter array comprises a first-type optical filter array and a second-type optical filter array, wherein:

the first-type optical filter array comprises spectral information of a first band range, the second-type optical filter array comprises spectral information of a second band range, and the spectral information of the second band range is different from the spectral information of the first band range, or the spectral information of the second band range and the spectral information of the first band range overlap within a preset band range;

the first-type optical filter array comprises a first sub-type optical filter array and a second sub-type optical filter array, the first sub-type optical filter array and the second sub-type optical filter array have the same quantity of channels, spectral information of band range of the first sub-type optical filter array is different from spectral information of band range of the second sub-type optical filter array, and each of the first sub-type optical filter array and the second sub-type optical filter array comprises at least three distinct channels; and a quantity of distinct channels of the second-type optical filter array is greater than a quantity of distinct channels of the first-type optical filter array.

20. The electronic device according to claim 19, wherein the electronic device further comprises:

at least one processor; and one or more memories coupled to the at least one processor and storing programming instructions for execution by the at least one processor to:

perform illumination intensity estimation, white balance processing, and demosaicing processing on an image obtained by a first-type optical filter array to obtain a first image;

perform illumination intensity estimation, white balance processing, and demosaicing processing on an image obtained by a second-type optical filter array to obtain a second image; and perform fusion processing on the first image and the second image to obtain a high-resolution hyperspectral image.

* * * * *